US008063551B1

(12) United States Patent
Stainer et al.

(10) Patent No.: US 8,063,551 B1

(45) Date of Patent: Nov. 22, 2011

(54) PIXEL INTENSITY HOMOGENEITY IN ORGANIC ELECTRONIC DEVICES

(75) Inventors: Matthew Stainer, Goleta, CA (US); Ian D. Parker, Santa Barbara, CA (US); Jeffrey G. Innocenzo, Towanda, PA (US); Gang Yu, Santa Barbara, CA (US)

(73) Assignee: E.I. Du Pont De Nemours and Company, Wilmington, DE (US)

( * ) Notice: Subject to any disclaimer, the term of this patent is extended or adjusted under 35 U.S.C. 154(b) by 0 days.

(21) Appl. No.: 11/313,131

(22) Filed: Dec. 20, 2005

Related U.S. Application Data

(60) Provisional application No. 60/640,812, filed on Dec. 29, 2004.

(51) Int. Cl.
*H05B 33/14* (2006.01)
*H01L 21/20* (2006.01)
*H05B 33/00* (2006.01)

(52) U.S. Cl. ........ 313/503; 313/504; 313/505; 313/506; 313/507; 445/24; 445/25

(58) Field of Classification Search .......... 313/507–509, 313/504
See application file for complete search history.

(56) References Cited

U.S. PATENT DOCUMENTS 5,438,241 A * 8/1995 Zavracky et al. .......... 315/169.3
5,684,365 A * 11/1997 Tang et al. ................. 315/169.3
6,303,238 B1 10/2001 Thompson et al. ........... 428/690
6,373,453 B1 * 4/2002 Yudasaka ........................ 345/76
6,670,645 B2 12/2003 Grushin et al. ................. 257/98
6,710,540 B1 * 3/2004 Albert et al. .................. 313/498
6,724,973 B1 * 4/2004 Takeuchi et al. .............. 385/147
6,777,887 B2 * 8/2004 Koyama ..................... 315/169.3
6,831,407 B2 * 12/2004 Cok ............................. 313/504
6,911,773 B2 * 6/2005 Seki ............................. 313/506
2002/0126073 A1 * 9/2002 Knapp et al. .................... 345/76
2003/0127657 A1 * 7/2003 Park ............................... 257/79
2003/0205709 A1 * 11/2003 Lu .................................. 257/72
2004/0094768 A1 * 5/2004 Yu et al. .......................... 257/79
2004/0140759 A1 * 7/2004 Park et al. ..................... 313/504
2004/0180457 A1 * 9/2004 Birnstosk et al. ............... 438/22
2004/0201048 A1 * 10/2004 Seki et al. ..................... 257/294
2004/0263058 A1 * 12/2004 Wu et al. ....................... 313/500
2004/0263072 A1 * 12/2004 Park et al. ..................... 313/509
2005/0052120 A1 * 3/2005 Gupta et al. .................. 313/503
2005/0191781 A1 * 9/2005 Hirai .............................. 438/30
2006/0035469 A1 * 2/2006 Truong et al. ................. 438/739
2006/0145365 A1 * 7/2006 Halls et al. ............ 257/E51.022

FOREIGN PATENT DOCUMENTS

WO WO 00/70655 11/2000

(Continued)

*Primary Examiner* — Anne Hines
*Assistant Examiner* — Tracie Green
(74) *Attorney, Agent, or Firm* — Woodcock Washburn LLP

(57) ABSTRACT

In the fabrication of a display, such as an OLED display, the OLED layer stack is deposited on an electrode on the substrate. The electrode may be the anode and may comprise indium tin oxide (ITO). Desirably, the deposited films are of uniform thickness over the entire active area of the electrode. If the films are not uniform, then areas that are thicker will not emit light, and areas that are too thin may emit light in a less than optimum efficient way (power loss) and/or result in leakage current leaks through the device in a way that does not generate photons. An active-matrix organic light emitting diode comprises a substrate with a larger well size or wider channel width compared to the emission area. This improves the effective aperture ratio, which improves pixel intensity homogeneity.

20 Claims, 4 Drawing Sheets

110
100

110
115 130 130 100 120

FOREIGN PATENT DOCUMENTS

| | | | |
|---|---|---|---|
| WO | WO 01/41512 | A1 | 6/2001 |
| WO | WO 03/008424 | A1 | 1/2003 |
| WO | WO 03/040257 | A1 | 5/2003 |
| WO | WO 03/063555 | A1 | 7/2003 |
| WO | WO 03/091688 | A2 | 11/2003 |
| WO | WO 2004/016710 | A1 | 2/2004 |

* cited by examiner

PIXEL INTENSITY HOMOGENEITY IN ORGANIC ELECTRONIC DEVICES

CROSS REFERENCE

This application claims benefit to U.S. Provisional Application Ser. No. 60/640,812 filed Dec. 29, 2004, the disclosure of which is incorporated herein by reference in its entirety.

FIELD

This disclosure relates generally to organic electronic devices and more specifically to active-matrix organic light emitting diodes (OLEDs).

BACKGROUND

Organic electronic devices convert electrical energy into radiation, detect signals through electronic processes, convert radiation into electrical energy, or include one or more organic semiconductor layers. In the fabrication of a display, such as an OLED display, the OLED layer stack is deposited as films on an electrode on the substrate. If the films are not uniform, then areas that are thicker will not emit light, and areas that are too thin may emit light in a less than optimum efficient way and/or result in leakage current leaks through the device in a way that does not generate photons.

Conventional active-matrix organic light emitting diodes (AMOLEDs) suffer from pixel intensity inhomogeneity. It would be desirable to improve the pixel intensity homogeneity in AMOLEDs.

SUMMARY

The present invention is directed to improving the pixel intensity homogeneity in AMOLEDs by providing a substrate with larger well size or wider channel width compared to the emission area. This improves the effective aperture ratio, which improves pixel intensity homogeneity.

The foregoing general description and the following detailed description are exemplary and explanatory only and are not restrictive of the invention, as defined in the appended claims.

BRIEF DESCRIPTION OF THE DRAWINGS

Embodiments are illustrated in the accompanying figures to improve understanding of concepts as presented herein.

The figures are provided by way of example and are not intended to limit the invention. Skilled artisans appreciate that objects in the figures are illustrated for simplicity and clarity and have not necessarily been drawn to scale. For example, the dimensions of some of the objects in the figures may be exaggerated relative to other objects to help to improve understanding of embodiments.

DETAILED DESCRIPTION

An organic device substrate is provided with a larger well size or wider channel width as compared to an emission area. This improves the effective aperture ratio, which improves the pixel intensity homogeneity.

In the fabrication of a display, such as an OLED display, the OLED layer stack is deposited on an electrode on the substrate. The electrode may be the anode and may comprise indium tin oxide (ITO). Desirably, the deposited films are of uniform thickness over the entire active area of the electrode. If the films are not uniform, then areas that are thicker will not emit light, and areas that are too thin may emit light in a less than optimum efficient way (power loss) and/or result in leakage current leaks through the device in a way that does not generate photons.

Figure 1A:
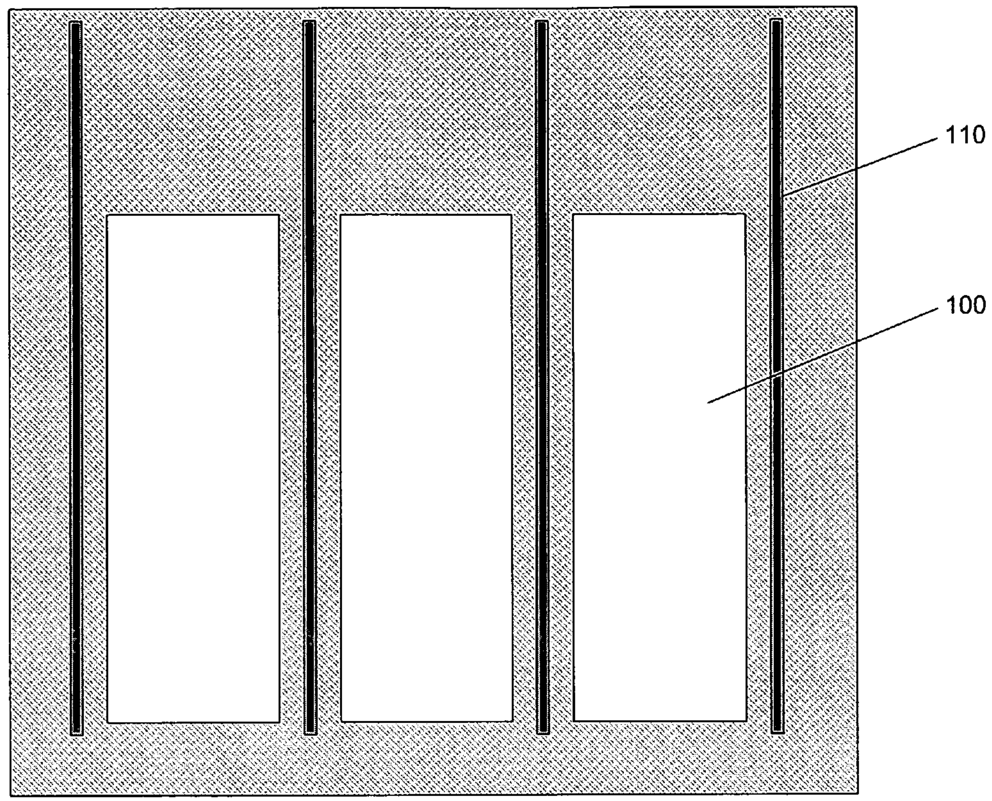
FIG. 1A is an overhead schematic diagram of an exemplary structure showing channel type wells in accordance with the present invention.
Figure 1B:
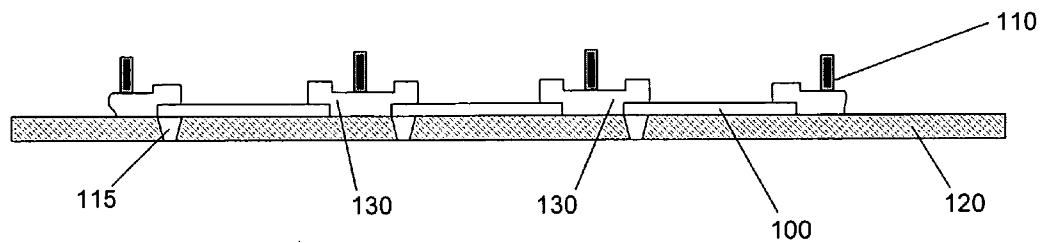
FIG. 1B is a cross-sectional view of the exemplary structure of FIG. 1A.

FIG. 1A is an overhead schematic diagram of an exemplary structure showing channel type wells in accordance with the present invention, and FIG. 1B is a cross-sectional view of the exemplary structure. Channel containment structures 110 are provided on a glass substrate 120 along with ITO electrodes 100. The ITO electrodes 100 are each connected to a respective via 115. An insulator layer 130 may also be provided between the channel containment structure 110 and the ITO electrodes 100. The emitting zone is essentially the ITO electrode 100 area.

Some factors come into play when substrate structures are designed to act as containment structures 110. For example, in the fabrication of a color display, the red, green, and blue films are maintained separately as they are deposited. They are typically deposited as stripes or lines, and thus must be prevented from mixing one into another.

Figure 2:
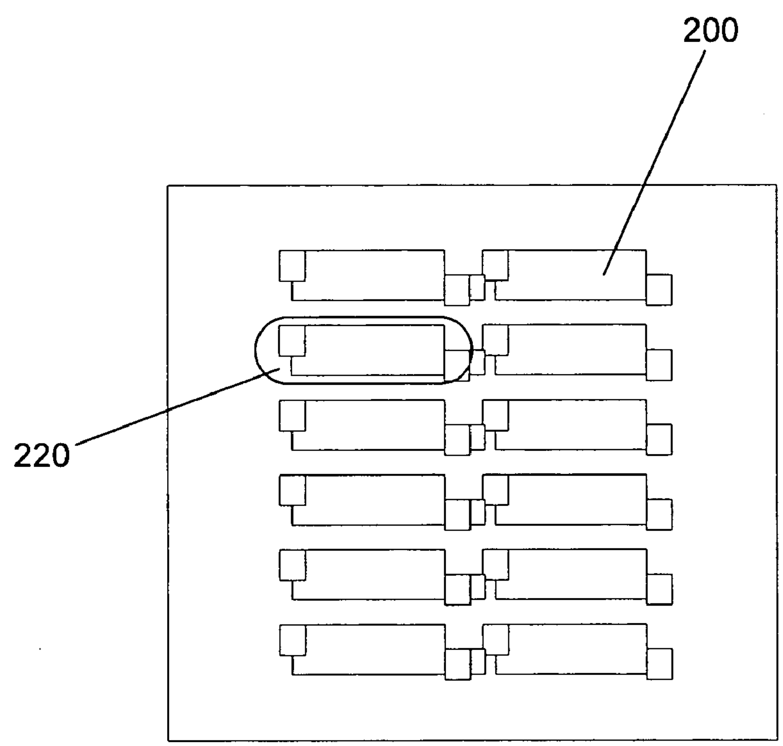
FIG. 2 is a diagram of an example array of pixels, with an example well shape in accordance with the present invention.
Figure 3:
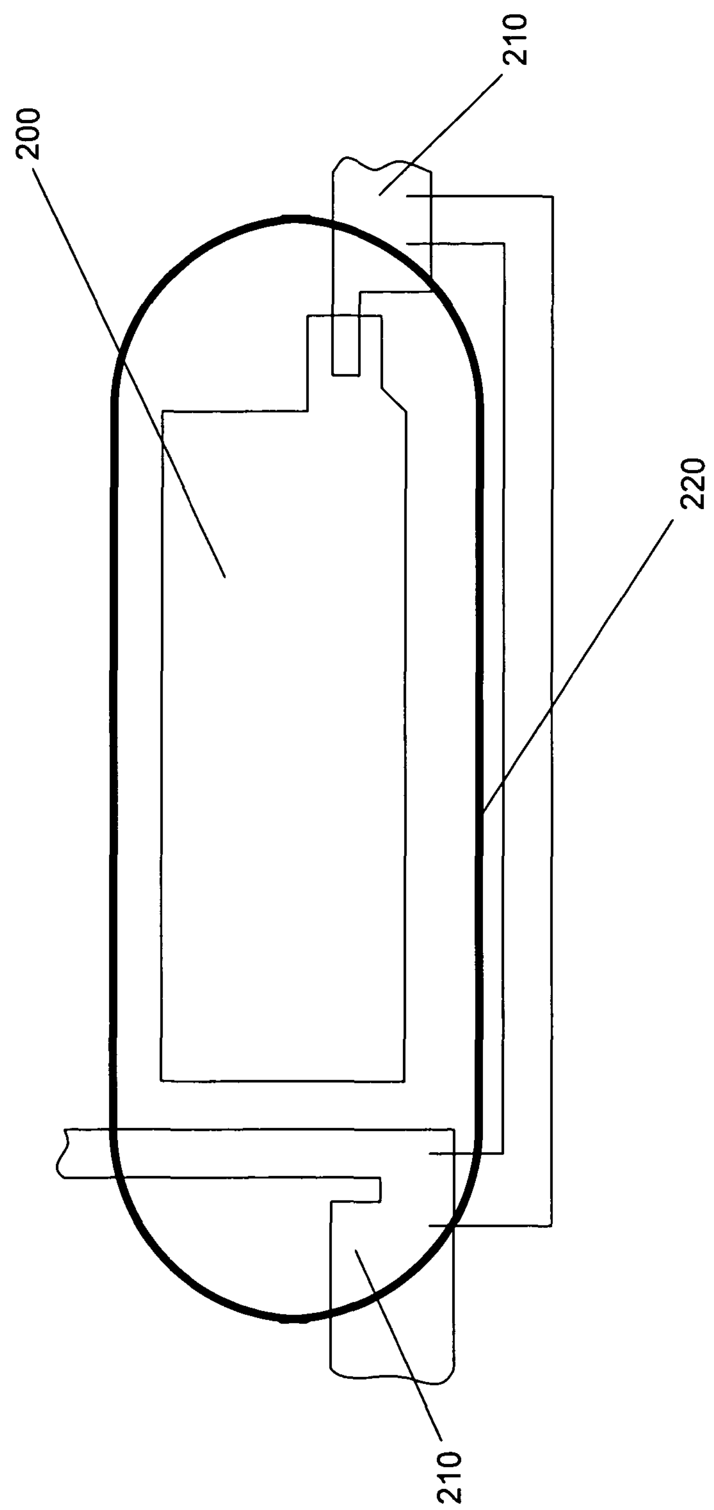
FIG. 3 is a diagram of a portion of an example array in accordance with the present invention.

For example, a photoresist "bank" structure can be used as a containment structure either as channels (e.g., FIGS. 1A and 1B) or wells (e.g., FIGS. 2 and 3). The wells may be oval shaped. Containment is achieved by rendering the resist material non-wetting either by treatment of the material or by using a material that is intrinsically non-wetting.

The edges of the printed films at the non-wetting bank can be very thin. As a result, the bank should be pulled back away from the edge of the ITO electrode 100 to eliminate nonuniform thickness films over the ITO electrode 100 and also leakage pathways through very thin films or even adventitious voids at the edge. The area between the edge of the bank 110 and the edge of the ITO electrode 100 may covered with an insulator layer 130 such as an inorganic dielectric. This insulator layer 130 desirably is disposed underneath the bank layer 110 and lie either over or under the ITO electrode 100 at its edge. An inorganic oxide or nitride is preferred as an insulator layer 130 as it will not be made non-wetting by treatment in a fluorine containing plasma. Alternatively, if an intrinsically non-wetting bank material is used that does not require treatment, an organic material can be used.

If the films are deposited using solution processing methods such as ink jetting, obtaining uniform films is a challenge. As the films dry (e.g., solvent evaporates), nonuniformities may result, especially at the edges. Careful choice of solvents and drying conditions can minimize the area and regions where any specific film layer in the stack is either thicker or thinner than desired uniform film thickness. However, these regions are very difficult to eliminate at the edges. Therefore, it is desirable that the nonuniform edge region is not located over the active area of the electrode 100. It is desirable to maximize the area of the electrode with a given thin film transistor (TFT) panel design and at the same time give up as little area as possible at the edge where the films can be allowed to be nonuniform.

Ovals are closed off channels and may also be used. In the case of ovals, each individual color sub-pixel has its own containment well. Since color printing is normally done in columns of color (all the sub-pixels in column are the same color on of either red, green or blue) the need to contain the color "inks" in the column direction may not be required so a containment channel can be used.

FIG. 2 shows a diagram of an example array of pixels, with an example well shape 220 as marked, and FIG. 3 is a diagram of a portion of an example array. This is an exemplary design that may be used for QCIF+(220_33 RGB×180). An example pixel pitch size is 198 microns. An example sub-pixel area is 66×198. The oval area 220 shown in FIG. 2 represents the well pattern, which is desirably larger than the ITO electrode 200 (rectangular shape represented by the emitting area).

Turning to FIG. 3, an ITO electrode 200 is in electrical contact with a thin film transistor (TFT) panel 210. A well opening 220 is provided in a containment structure. In the example, the well opening 220 is oval shaped. The containment structure desirably is continuous over the device with openings 220 centered over the ITO electrodes 200. The well pattern desirably is arrayed from the single well pattern. The bottom of the well 220 is desirably smaller than the first conductor pad, and is open to the ITO electrode 200.

As noted above, the emitting zone is essentially the ITO electrode area. When inkjet printing or otherwise dispensing ink into the well, the thicker or thinner edge area may cause inhomogeneous emission in emitting zone. A typical inhomogeneous edge area is between about 5 and 15 microns wide, for example. When the well size is moved out of the emitter zone for larger than that amount, uniform emission in the emission area is obtained.

There may be insulator layers underneath the well pattern, which is itself an insulator. In such a case, the insulator layer desirably goes up to the edge of the ITO electrode and thus covers the area inside of the well that is not an ITO electrode. The insulator layer desirably has the property that it remains, through all the processing, "wetting" such that solution inks when printed or coated on it can cover it.

For the cases in which the first electrode lays on top of an insulating planarization layer and the pixel driver and bus lines imbedded underneath it, only the larger bank layer may be needed. For the cases in which the ITO pad lies on the same level of part of the pixel drivers (e.g., in a-Si design, an ITO layer is also used for bridging pixel circuit and for other functions), it is desired to use an insulation layer covering the area out of ITO. The material for such a thin insulation layer could be inorganic such as SiN or $SiO_2$, or organic (such as PMMA or PE), for example. The patterning for such an insulating layer could be performed by printing or photolithograph, for example.

Figure 4:
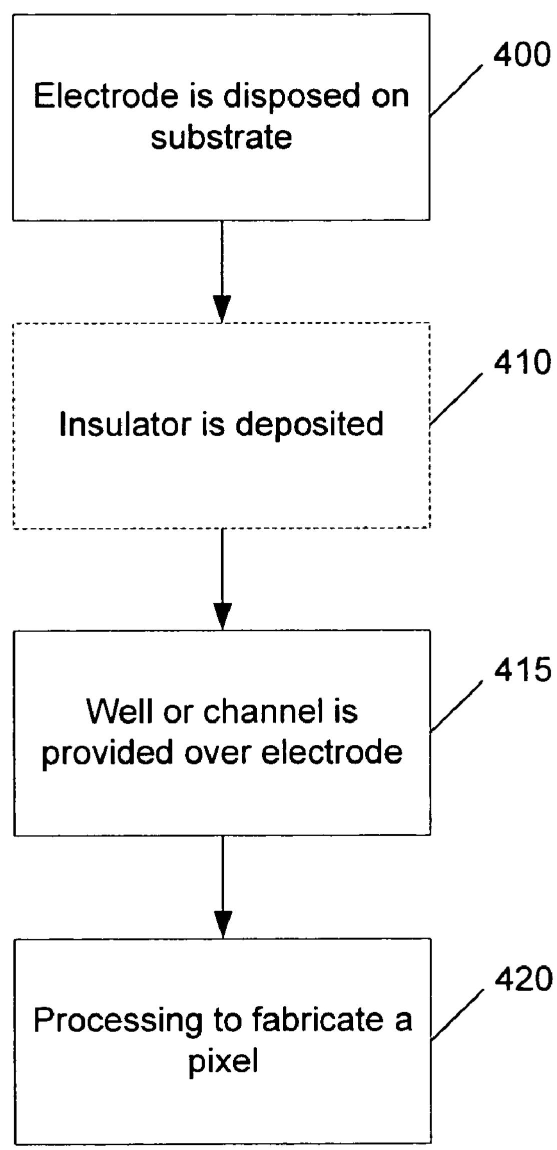
FIG. 4 is a flow diagram of an example fabrication process in accordance with the present invention.

FIG. 4 is a flow diagram of an example fabrication process in accordance with the present invention. At step 400, an electrode is disposed on a substrate as a film, for example, using any deposition technique, such as inkjet printing. A channel containment structure, such as a well or channel, is then provided or patterned over the electrode, at step 415. If a well is used, it is larger than the emission area of the electrode, and if a channel is used, then it is wider than the emission area. Subsequent processing is performed to fabricate a pixel, at step 420. Optionally, e.g., at step 410, an insulator layer is deposited with the property that it remains wetting through subsequent processing. For example, the insulator may be deposited on the electrode or the electrode may be deposited on top of the insulator with a via connection.

Although examples herein are described with respect to AMOLEDs, the invention is not limited to AMOLEDs. Aspects of the invention may be used in passive matrix displays, for example, as well as in printed electronics application where a containment structure or layer is used and film uniformity is a consideration.

In accordance with aspects of the present invention, a larger effective aperture ratio is obtained. Moreover, a higher pixel density may be obtained.

The term "active-matrix" is intended to mean an array of electronic components and corresponding driver circuits within the array.

The term "aperture ratio" is intended to mean a ratio of the area of a pixel available for emitting or responding to radiation to the total area of the pixel. The aperture ratio is typically expressed as a percentage. An effective aperture ratio is usually less than a nominal aperture ratio because light emission is stopped by thicker layers in the stack. Thicker layers lead to higher resistance to holes or electrons, thus limiting current flow and therefore light emission in those areas. Nominal aperture ratio is a straight ratio of the area of the electrode to that of the total pixel.

The term "emit," when referring to a radiation-emitting component, is intended to mean the emanation of radiation at a targeted wavelength or spectrum of wavelengths from such radiation-emitting component.

The terms "emitter" refer to a material that emits light when activated by an applied voltage (such as in a light-emitting diode or light-emitting electrochemical cell).

The term "pixel" is intended to mean a portion of an array corresponding to one electronic component and its corresponding electronic component(s), if any, that are dedicated to that specific one electronic component. In one embodiment, a pixel has an OLED and its corresponding pixel driving circuit. Note that a pixel as used in this specification can be a pixel or subpixel as those terms are used by skilled artisans outside of this specification.

The term "substrate" is intended to mean a base material that can be either rigid or flexible and may be include one or more layers of one or more materials, which can include, but are not limited to, glass, polymer, metal or ceramic materials or combinations thereof. The reference point for a substrate is the beginning point of a process sequence. The substrate may or may not include electronic components, circuits, or conductive members.

The term "well structure" is intended to mean a structure overlying a substrate, wherein the structure serves a principal function of separating an object, a region, or any combination thereof within or overlying the substrate from contacting a different object or different region within or overlying the substrate. An example of a well structure is a well that can circumscribe an object or a region. Another example of a well structure is a channel that can separate an object or a region from a different object or region without circumscribing either the object or region or the different object or region.

The term "wetting" is intended to mean a phenomenon involving a solid and a liquid in such intimate contact that the adhesive force between the two phases is greater than the cohesive force within the liquid. Thus a solid that is wetted, on being removed from the liquid bath, will have a thin continuous layer of liquid adhering to it.

The term "hydrophilic" is intended to mean that an edge of a liquid exhibits a wetting angle less than 90 degrees with respect to a surface that it contacts.

The term "hydrophobic" is intended to mean that an edge of a liquid exhibits a wetting angle of 90 degrees or more with respect to a surface that it contacts.

The term "wetting angle" or "contact angle" is intended to mean a tangent angle defined by (1) a solid surface and (2) an interface between a gas and a liquid at the solid surface as measured from the solid surface through the liquid to the gas-liquid interface.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, for clarity purposes and to give a general sense of the scope of the embodiments described herein, the use of the "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductive member arts.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Many aspects and embodiments have been described above and are merely exemplary and not limiting. After reading this specification, skilled artisans appreciate that other aspects and embodiments are possible without departing from the scope of the invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges include each and every value within that range.

The invention claimed is:

1. An active-matrix organic light emitting diode (AMOLED) comprising:
- a substrate;
- a containment structure disposed on the substrate, wherein the containment structure defines a containment area; and
- an electrode disposed on the substrate, the electrode having an electrode area, wherein the containment structure provides pixel intensity homogeneity, and
- wherein the containment area is larger than the electrode area.

2. The AMOLED of claim 1, wherein the containment structure provides an effective aperture ratio that provides the pixel intensity homogeneity.

3. The AMOLED of claim 1, wherein the containment structure comprises a channel that defines the containment area.

4. The AMOLED of claim 1, wherein the containment structure comprises a well that defines the containment area.

5. The AMOLED of claim 4, wherein the well is oval shaped.

6. The AMOLED of claim 1, wherein the containment structure comprises a photoresist bank structure.

7. The AMOLED of claim 6, wherein the photoresist in the photoresist bank structure is non-wetting.

8. The AMOLED of claim 1, further comprising an insulator layer disposed between the containment structure and the electrode.

9. A display device comprising:
- a substrate; and
- an organic light emitting diode stack disposed on the substrate and comprising a containment structure disposed on the substrate, and an electrode disposed on the substrate,
- wherein the electrode includes an electrode area and the containment structure defines a containment area that is larger than the electrode area, and
- wherein the containment structure provides pixel intensity homogeneity.

10. The device of claim 9, wherein the organic light emitting diode stack comprises an active-matrix organic light emitting diode (AMOLED).

11. The device of claim 9, wherein the containment structure provides an effective aperture ratio that provides the pixel intensity homogeneity.

12. The device of claim 9, wherein the containment structure comprises a channel that defines the containment area.

13. The device of claim 9, wherein the containment structure comprises a well that defines the containment area.

14. The device of claim 13, wherein the well is oval shaped.

15. The device of claim 9, wherein the containment structure comprises a non-wetting photoresist bank structure.

16. The device of claim 9, further comprising an insulator layer disposed between the containment structure and the electrode.

17. A method of fabricating an organic electronic device, comprising:

depositing an electrode on a substrate, the electrode having an electrode area; and forming a containment structure over the electrode, the containment structure providing pixel intensity homogeneity, wherein the containment structure defines a containment area that is larger than the electrode area.

18. The method of claim 17, wherein forming the containment structure over the electrode comprises forming a channel that defines the containment area.

19. The method of claim 17, wherein forming the containment structure over the electrode comprises forming a well that defines the containment area.

20. The method of claim 19, wherein the well is oval shaped.

* * * * *